(12) United States Patent
Nemani et al.

(10) Patent No.: US 6,465,366 B1
(45) Date of Patent: Oct. 15, 2002

(54) DUAL FREQUENCY PLASMA ENHANCED CHEMICAL VAPOR DEPOSITION OF SILICON CARBIDE LAYERS

(75) Inventors: Srinivas Nemani, San Jose; Li-Qun Xia, Santa Clara; Ellie Yieh, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 15 days.

(21) Appl. No.: 09/660,268

(22) Filed: Sep. 12, 2000

(51) Int. Cl.[7] .................. H01L 21/31; H01L 21/469; C23C 16/32
(52) U.S. Cl. .................................................. 438/778
(58) Field of Search ........................................ 438/778

(56) References Cited

U.S. PATENT DOCUMENTS

| | | | |
|---|---|---|---|
| 5,800,878 A | 9/1998 | Yao | 427/573 |
| 6,041,734 A | 3/2000 | Raoux et al. | 118/723 E |
| 6,140,226 A | 10/2000 | Grill et al. | 438/637 |
| 6,147,009 A | 11/2000 | Grill et al. | 438/780 |
| 6,159,871 A | 12/2000 | Loboda et al. | 438/786 |
| 6,255,211 B1 * | 7/2001 | Olsen et al. | 438/624 |
| 6,261,892 B1 * | 7/2001 | Swanson | 438/238 |
| 6,316,167 B1 | 11/2001 | Angelopoulos et al. | 430/313 |
| 6,340,435 B1 * | 1/2002 | Bjorkman et al. | 216/72 |
| 2002/0016085 A1 * | 2/2002 | Huang et al. | 438/798 |

FOREIGN PATENT DOCUMENTS

| | | | | |
|---|---|---|---|---|
| GB | 0725440 A2 * | 8/1996 | | H01L/23/532 |
| WO | WO 99/41423 | 8/1999 | | |

* cited by examiner

Primary Examiner—Michael S. Lebentritt
Assistant Examiner—Beth E. Owens
(74) Attorney, Agent, or Firm—Moser, Patterson & Sheridan

(57) ABSTRACT

A method for forming a silicon carbide layer for use in integrated circuit fabrication is disclosed. The silicon carbide layer is formed by reacting a gas mixture comprising a silicon source, a carbon source, and an inert gas in the presence of an electric field. The electric field is generated using mixed frequency radio frequency (RF) power. The silicon carbide layer is compatible with integrated circuit fabrication processes. In one integrated circuit fabrication process, the silicon carbide layer is used as a hardmask for fabricating integrated circuit structures such as, for example, a damascene structure. In another integrated circuit fabrication process, the silicon carbide layer is used as an antireflective coating (ARC) for DUV lithography.

44 Claims, 4 Drawing Sheets

DUAL FREQUENCY PLASMA ENHANCED CHEMICAL VAPOR DEPOSITION OF SILICON CARBIDE LAYERS

BACKGROUND OF THE DISCLOSURE

1. Field of the Invention

The present invention relates to silicon carbide layers and, more particularly to a method of forming silicon carbide layers.

2. Description of the Background Art

Integrated circuits have evolved into complex devices that can include millions of components (e. g., transistors, capacitors and resistors) on a single chip. The evolution of chip designs continually requires faster circuitry and greater circuit densities. The demands for greater circuit densities necessitate a reduction in the dimensions of the integrated circuit components.

As the dimensions of the integrated circuit components are reduced (e. g., sub-micron dimensions), the materials used to fabricate such components contribute to the electrical performance of such components. For example, low resistivity metal interconnects (e. g., aluminum and copper) provide conductive paths between the components on integrated circuits.

Typically, the metal interconnects are electrically isolated from each other by an insulating material. When the distance between adjacent metal interconnects and/or the thickness of the insulating material has sub-micron dimensions, capacitive coupling potentially occurs between such interconnects. Capacitive coupling between adjacent metal interconnects may cause cross talk and/or resistance-capacitance (RC) delay which degrades the overall performance of the integrated circuit. In order to minimize capacitive coupling between adjacent metal interconnects, low dielectric constant (low k) insulating materials (e. g., dielectric constants less than about 5.0) are needed.

In addition, a barrier layer often separates the metal interconnects from the low dielectric constant (low k) insulating materials. The barrier layer minimizes the diffusion of the metal into the insulating material. Diffusion of the metal into the insulating material is undesirable because such diffusion can affect the electrical performance of the integrated circuit, or render it inoperative.

The demands for greater integrated circuit densities also impose demands on the process sequences used for integrated circuit manufacture. For example, in process sequences using conventional lithographic techniques, a layer of energy sensitive resist is formed over a stack of material layers on a substrate. Many of these underlying material layers are reflective to ultraviolet light. Such reflections can distort the dimensions of features such as lines and vias that are formed in the energy sensitive resist material.

One technique proposed to minimize reflections from an underlying material layer uses an anti-reflective coating (ARC). The ARC is formed over the reflective material layer prior to resist patterning. The ARC suppresses the reflections off the underlying material layer during resist imaging, providing accurate pattern replication in the layer of energy sensitive resist.

Silicon carbide (SiC) has been suggested for use as a barrier layer and/or ARC on integrated circuits, since silicon carbides can have a low dielectric constant (dielectric constant less than about 5.0), are good diffusion barriers and can have good light absorption properties.

However, silicon carbide barrier layers are typically formed using chemical vapor deposition (CVD) techniques. SiC layers formed using CVD techniques, tend to have a high oxygen content (e. g., oxygen content greater than about 4%). A high oxygen content is undesirable because it may enhance the diffusion of metals such as, for example, copper, from the metal interconnects through the SiC layer into the insulating material.

Therefore, a need exists in the art for a method of forming a reliable SiC diffusion barrier for integrated circuit fabrication. Particularly desirable would be a SiC diffusion barrier that is also an ARC.

SUMMARY OF THE INVENTION

A method of forming a silicon carbide layer for use in integrated circuit fabrication processes is provided. The silicon carbide layer is formed by reacting a gas mixture including a silicon source, a carbon source, and an inert gas in the presence of an electric field. The electric field is generated using mixed frequency radio frequency (RF) power.

The silicon carbide layer is compatible with integrated circuit fabrication processes. In one integrated circuit fabrication process, the silicon carbide layer is used as a hardmask for fabricating integrated circuit structures such as, for example, a damascene structure. For such an embodiment, a preferred process sequence includes depositing a silicon carbide layer on a substrate. After the silicon carbide layer is deposited on the substrate, a pattern is defined therein. Thereafter, the integrated circuit structure is fabricated by transferring the pattern defined in the silicon carbide layer into the substrate using the silicon carbide layer as a hardmask.

In another integrated circuit fabrication process, the silicon carbide layer is used as an anti-reflective coating (ARC) for DUV lithography. For such an embodiment, a preferred process sequence includes forming the silicon carbide layer on a substrate. The silicon carbide layer has a refractive index (n) in a range of about 1.7 to about 2.1 and an absorption coefficient (κ) in a range of about 0.1 to about 0.7 at wavelengths less than about 250 nm. The refractive index (n) and the absorption coefficient (κ) for the silicon carbide layer are tunable, in that they can be varied in the desired range as a function of the deposition temperature as well as the carbon content of the gas mixture during SiC layer formation. After the silicon carbide layer is formed on the substrate, a layer of energy sensitive resist material is formed thereon. A pattern is defined in the energy sensitive resist at a wavelength less than about 250 nm. Thereafter, the pattern defined in the energy sensitive resist material is transferred into the silicon carbide layer. After the silicon carbide layer is patterned, such pattern is optionally transferred into the substrate.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
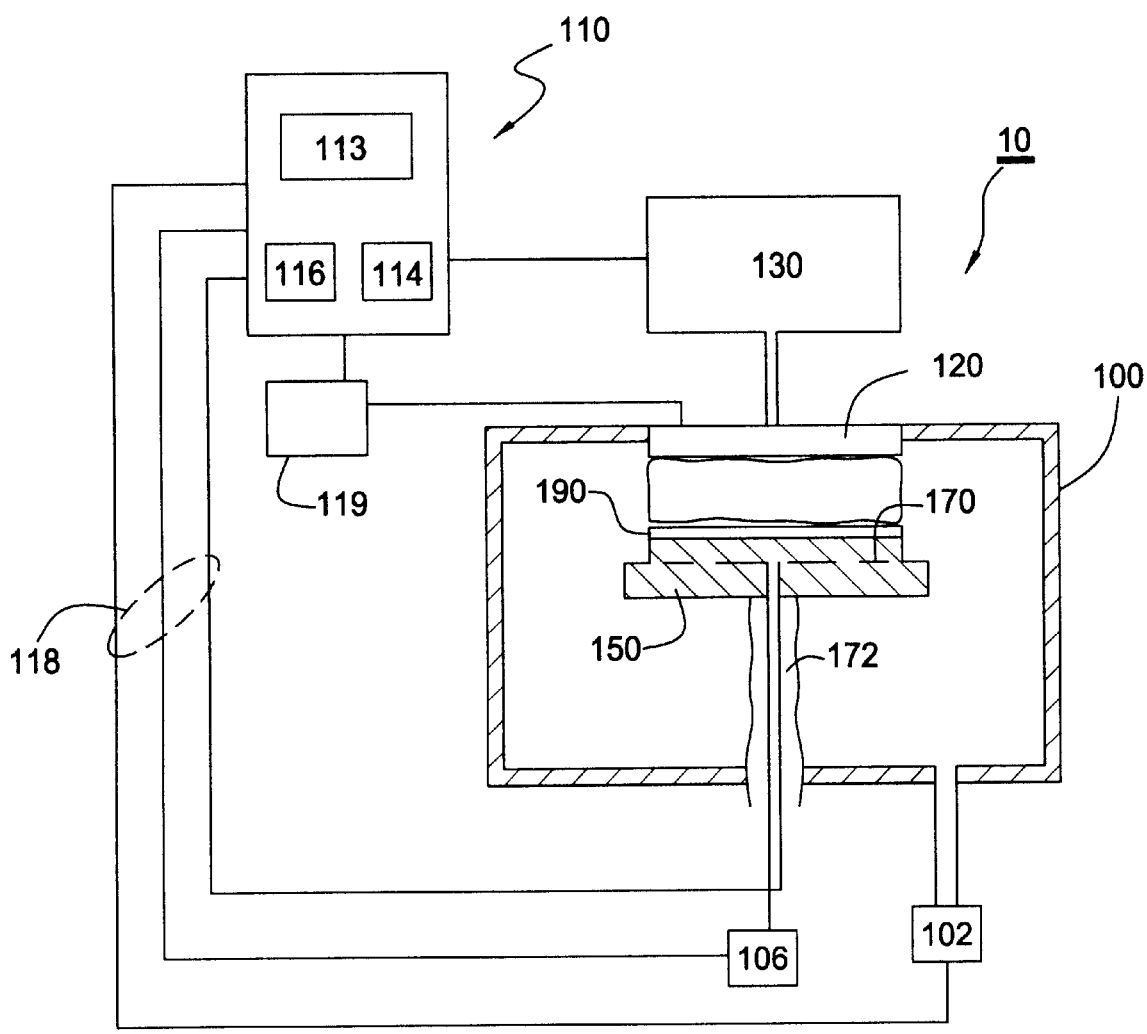
FIG. 1 depicts a schematic illustration of an apparatus that can be used for the practice of embodiments described herein.

FIG. 1 is a schematic representation of a wafer processing system 10 that can be used to perform silicon carbide layer deposition in accordance with embodiments described herein. System 10 typically comprises a process chamber 100, a gas panel 130, a control unit 110, along with other hardware components such as power supplies 119, 106 and vacuum pumps 102. Examples of wafer processing system 10 include plasma enhanced chemical vapor deposition (PECVD) chambers such as DXZ™ chambers, commercially available from Applied Materials Inc., located in Santa Clara, Calif.

Details of wafer processing system 10 are described in commonly assigned U.S. patent application Ser. No. 09/211,998, entitled "High Temperature Chemical Vapor Deposition Chamber", filed on Dec. 14, 1998, and is herein incorporated by reference. The salient features of this system 10 are briefly described below.

The process chamber 100 generally houses a support pedestal 150, which is used to support a substrate such as a semiconductor wafer 190. This pedestal 150 can typically be moved in a vertical direction inside the chamber 100 using a displacement mechanism (not shown).

Depending on the specific process, the wafer 190 can be heated to some desired temperature prior to SiC layer deposition. For example, the wafer support pedestal 150 is heated by an embedded heater element 170. The pedestal 150 may be resistively heated by applying an electric current from an AC power supply 106 to the heater element 170. The wafer 190 is, in turn, heated by the pedestal 150.

A temperature sensor 172, such as a thermocouple, is also embedded in the wafer support pedestal 150 to monitor the temperature of the pedestal 150 in a conventional manner. The measured temperature is used in a feedback loop to control the power supplied to the heating element 170, such that the wafer temperature can be maintained or controlled at a desired temperature which is suitable for the particular process application. The pedestal is optionally heated using radiant heat (not shown).

A vacuum pump 102, is used to evacuate the process chamber 100 and to maintain the proper gas flows and pressure inside the chamber 100. A showerhead 120, through which process gases are introduced into the chamber 100, is located above the wafer support pedestal 150. The showerhead 120 is connected to a gas panel 130, which controls and supplies various gases used in different steps of the process sequence.

The showerhead 120 and wafer support pedestal 150 also form a pair of spaced apart electrodes. When an electric field is generated between these electrodes, the process gases introduced into the chamber 100 are ignited into a plasma. The electric field is generated by connecting the showerhead 120 to a source of mixed radio frequency (RF) power 119. Details of the mixed RF power source 119 are described in commonly assigned U.S. Pat. No. 6,041,734, entitled, "Use of an Asymmetric Waveform to Control Ion Bombardment During Substrate Processing", issued on Mar. 28, 2000, and is herein incorporated by reference.

Typically, the source of mixed RF power 119 under the control of a controller unit 110 provides a high frequency power (e. g., RF power in a range of about 10 MHz to about 15 MHz) as well as a low frequency power (e. g., RF power in a range of about 150 KHz to about 450 KHz) to the showerhead 120. Both the high frequency RF power and the low frequency RF power are coupled to the showerhead 120 through a matching network (not shown). The high frequency RF power source and the low frequency RF power source may optionally be coupled to the wafer support pedestal 150, or one may be coupled to the showerhead 120 and the other to the support pedestal 150.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Proper control and regulation of the gas flows through the gas panel 130 is performed by mass flow controllers (not shown) and the controller unit 110. The showerhead 120 allows process gases from the gas panel 130 to be uniformly introduced and distributed in the process chamber 100.

Illustratively, the control unit 110 comprises a central processing unit (CPU) 113, support circuitry 114, and memories containing associated control software 116. The control unit 110 is responsible for automated control of the numerous steps required for wafer processing—such as wafer transport, gas flow control, mixed RF power control, temperature control, chamber evacuation, and other steps. Bi-directional communications between the control unit 110 and the various components of the wafer processing system 10 are handled through numerous signal cables collectively referred to as signal buses 118, some of which are illustrated in FIG. 1.

The central processing unit (CPU) 113 may be one of any form of general purpose computer processor that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Process sequence routines as required may be stored in the memory or executed by a second CPU that is remotely located.

The process sequence routines are executed after the substrate 190 is positioned on the wafer support pedestal 150. The process sequence routines, when executed, transform the general purpose computer into a specific process computer that controls the chamber operation so that the deposition process is performed. Alternatively, the chamber operation may be controlled using remotely located hardware, as an application specific integrated circuit or other type of hardware implementation, or a combination of software and hardware.

Silicon Carbide Layer Formation

In one embodiment, the silicon carbide layer is formed by reacting a gas mixture including a silicon source, a carbon source, and an inert gas. The silicon source and the carbon source may be an organosilane compound having the general formula $Si_xC_yH_z$, where x has a range from 1 to 2, y has a range from 1 to 6, and z has a range from 6 to 20. For example, methylsilane ($SiCH_6$), dimethylsilane ($SiC_2H_8$), trimethylsilane ($SiC_3H_{10}$), tetramethylsilane ($SiC_4H_{12}$), and diethylsilane ($SiC_4H_{12}$), among others may be used as the organosilane compound. Alternatively, silane ($SiH_4$), disilane ($Si_2H_6$), methane ($CH_4$), and combinations thereof, may be used as the silicon source and the carbon source.

Helium (He), argon (Ar), nitrogen ($N_2$), or combinations thereof, among others, may be used for the inert gas.

In general, the following deposition process parameters can be used to form the silicon carbide layer. The process parameters range from a wafer temperature of about 200° C. to about 400° C., a chamber pressure of about 3 torr to about 15 torr, an organosilane compound flow rate of about 50 sccm to about 200 sccm, an inert gas flow rate of about 50 sccm to about 800 sccm (such that the ratio of organosilane compound flow to inert gas flow is in a range of about 1:1 to about 1:4), a plate spacing of about 300 mils to about 600 mils, and a mixed frequency RF power having at least a first RF power with a frequency in a range of about 13 MHz to about 27 MHz as well as a power in a range of about 200 watts to about 800 watts and at least a second RF power with a frequency in a range of about 100 KHz to about 500 KHz as well as a power in a range of about 1 watt to about 200 watts. The ratio of the second RF power to the total mixed frequency power is preferably less than about 0.6 to 1.0. The above process parameters provide a deposition rate for the silicon carbide layer in a range of about 1000 Å/min to about 5000 Å/min when implemented on a 200 mm (millimeter) substrate in a deposition chamber available from Applied Materials, Inc., located in Santa Clara, Calif.

Other deposition chambers are within the scope of the invention, and the parameters listed above may vary according to the particular deposition chamber used to form the silicon carbide layer. For example, other deposition chambers may have a larger or smaller volume, requiring gas flow rates that are larger or smaller than those recited for deposition chambers available from Applied Materials, Inc. and may be configured to accommodate 300 mm substrates.

An as-deposited silicon carbide layer has a dielectric constant that is less than about 4.5, making it suitable for use as an insulating material in integrated circuits. The dielectric constant of the silicon carbide layer is tunable, in that it can be varied as a function of the ratio of the mixed frequency RF powers. In particular, as the ratio of the low frequency RF power to the total mixed RF power decreases the dielectric constant of the as-deposited silicon carbide layer also decreases.

The dielectric constant of the silicon carbide layer can also be tuned as a function of the composition of the gas mixture during layer formation. As the carbon (C) concentration in the gas mixture increases, the C content of the as-deposited silicon carbide layer increases, decreasing its dielectric constant. Also, as the C content of the as-deposited silicon carbide layer increases the hydrophobic properties thereof increase, making such layers suitable for use as moisture barriers in integrated circuits.

In addition, the as-deposited silicon carbide layer has an oxygen content that is less than about 1%. It is believed that such an oxygen content minimizes metal diffusion and improves the barrier layer properties of the silicon carbide film. For example, the as-deposited silicon carbide layer has a current blocking ability at about 1 MV/cm (megavolts/centimeter) that is less than about $1\times10^{-9}$ $A/cm^2$, which is suitable for minimizing cross-talk between integrated circuit interconnect structures.

The silicon carbide layer also has a light absorption coefficient ($\kappa$) that can be varied between about 0.1 to about 0.7 at wavelengths below about 250 nm (nanometers), making it suitable for use as an anti-reflective coating (ARC) at DUV wavelengths. The absorption coefficient of the silicon carbide layer can be varied as a function of the deposition temperature as well as the carbon content of the gas mixture during layer formation. In particular, as the deposition temperature is increased the absorption coefficient of the as-deposited layer likewise increases. Also, as the carbon (C) concentration in the gas mixture increases, the C content of the as-deposited silicon carbide layer increases, increasing the absorption coefficient thereof.

Integrated Circuit Fabrication Processes

A. Silicon Carbide Hardmask

Figure 2A:
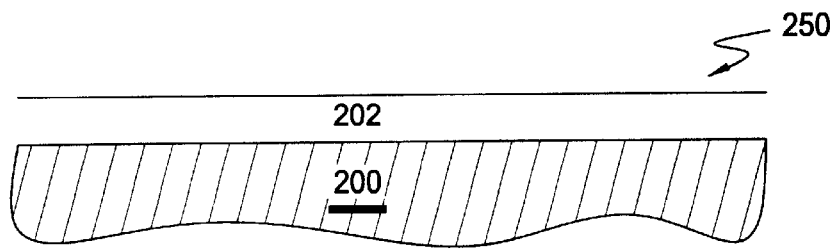
FIGS. 2a–2e depict schematic cross-sectional views of a substrate structure at different stages of integrated circuit fabrication incorporating a silicon carbide layer as a hardmask.

FIGS. 2a–2e illustrate schematic cross-sectional views of a substrate 200 at different stages of an integrated circuit fabrication sequence incorporating a silicon carbide layer as a hardmask. In general, the substrate 200 refers to any workpiece on which processing is performed, and a substrate structure 250 is used to generally denote the substrate together with other material layers formed on the substrate 200. Depending on the specific stage of processing, the substrate 200 may correspond to a silicon wafer, or other material layer that has been formed on the silicon wafer. FIG. 2a, for example, illustrates a cross-sectional view of a substrate structure 250, having a material layer 202 that has been conventionally formed thereon. The material layer 202 may be an oxide (e. g., silicon dioxide, organosilicate, fluorosilicate glass (FSG), carbon doped fluorosilicate glass). In general, the substrate 200 may include a layer of silicon, silicides, metals, or other materials. FIG. 2a illustrates one embodiment in which the substrate 200 is silicon having a silicon dioxide layer formed thereon.

Figure 2B:
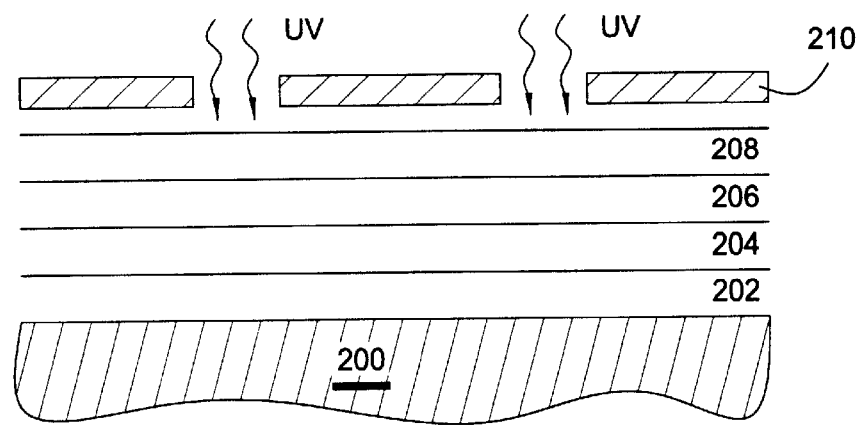

FIG. 2b depicts a silicon carbide layer 204 formed on the substrate structure 250 of FIG. 2a. The silicon carbide layer 204 is formed on the substrate structure 250 according to the process parameters described above. The thickness of the silicon carbide layer is variable depending on the specific stage of processing. Typically, the silicon carbide layer is deposited to a thickness of about 50 Å to about 1000 Å.

A layer of energy sensitive resist material 208 is formed on the silicon carbide layer 204. The layer of energy sensitive resist material 208 can be spin coated on the substrate to a thickness within a range of about 4,000 Å to about 10,000 Å. Most energy sensitive resist materials are sensitive to ultraviolet (UV) radiation having a wavelength less than about 450 nm (nanometers). Deep ultraviolet (DUV) resist materials are sensitive to UV radiation having wavelengths less than about 245 nm.

Dependent on the etch chemistry of the energy sensitive resist material used in the fabrication sequence, an intermediate layer 206 is formed on the silicon carbide layer 204. When the energy sensitive resist material 208 and the silicon carbide layer 204 can be etched using the same chemical etchants, the intermediate layer 206 functions as a mask for the silicon carbide layer 204. The intermediate layer 206 is conventionally formed on the silicon carbide layer 204. The intermediate layer 206 may be an oxide, nitride, silicon oxynitride, amorphous silicon, or other suitable material.

Figure 2C:
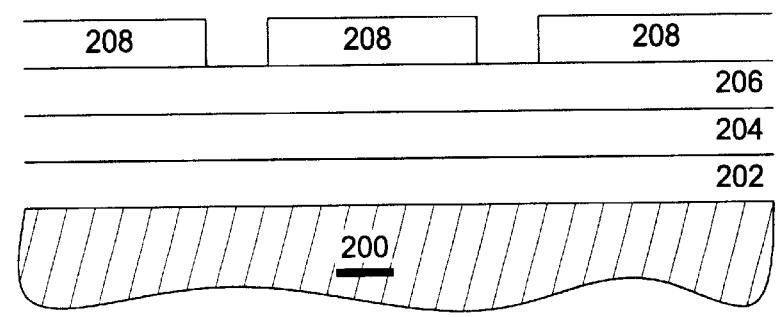
Figure 2D:
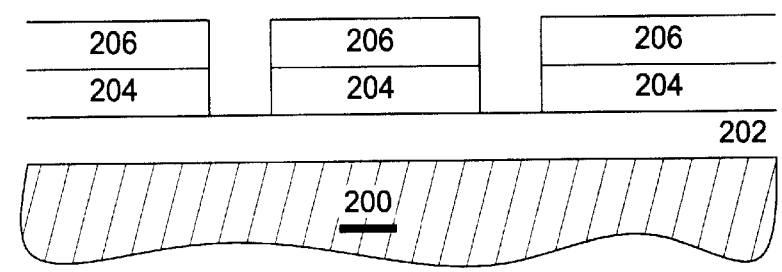

An image of a pattern is introduced into the layer of energy sensitive resist material 208 by exposing such energy sensitive resist material 208 to UV radiation via mask 210. The image of the pattern introduced in the layer of energy sensitive resist material 208 is developed in an appropriate developer to define the pattern therethrough, as shown in FIG. 2c. Thereafter, referring to FIG. 2d, the pattern defined in the energy sensitive resist material 208 is transferred through the silicon carbide layer 204. The pattern is transferred through the silicon carbide layer 204 using the energy sensitive resist material 208 as a mask. The pattern is transferred through the silicon carbide layer 204 using an appropriate chemical etchant. For example, carbon tetrafluoride ($CF_4$), or a gas mixture comprising trifluoromethane ($CHF_3$) and oxygen ($O_2$) may be used to chemically etch the silicon carbide layer 204.

Alternatively, when the intermediate layer 206 is present, the pattern defined in the energy sensitive resist material 208 is first transferred through the intermediate layer 206 using the energy sensitive resist material as a mask. Thereafter, the pattern is transferred through the silicon carbide layer 204 using the intermediate layer 206 as a mask. The pattern is transferred through both the intermediate layer 206 as well as the silicon carbide layer 204 using appropriate chemical etchants.

Figure 2E:
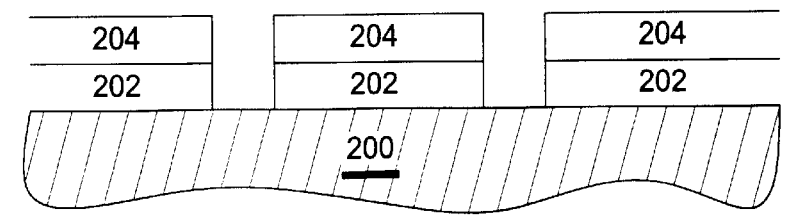

FIG. 2e illustrates the completion of the integrated circuit fabrication sequence by the transfer of the pattern defined in the silicon carbide layer 204 through the silicon dioxide layer 202 using the silicon carbide layer 204 as a hardmask.

After the silicon dioxide layer 202 is patterned, the silicon carbide layer 204 can optionally be stripped from the substrate 200 by etching it in a suitable chemical etchant.

B. Damascene Structure Incorporating a Silicon Carbide Layer

Figure 3A:
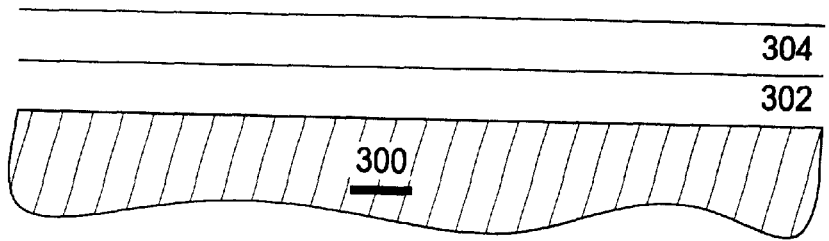
FIGS. 3a–3d depict schematic cross-sectional views of a damascene structure at different stages of integrated circuit fabrication incorporating a silicon carbide layer as a hardmask.

FIGS. 3a–3d illustrate schematic cross-sectional views of a substrate 300 at different stages of a damascene structure fabrication sequence incorporating a silicon carbide layer therein. Damascene structures are typically used to form metal interconnects on integrated circuits. Depending on the specific stage of processing, substrate 300 may correspond to a silicon wafer, or other material layer that has been formed on the substrate 300. FIG. 3a, for example, illustrates a cross-sectional view of a substrate 300 having a first dielectric layer 302 formed thereon. The first dielectric layer 302 may be an oxide (e. g., silicon dioxide, organosilicate, fluorosilicate glass (FSG), carbon doped fluorosilicate glass). In general, the substrate may include a layer of silicon, silicides, metals, or other materials.

FIG. 3a illustrates one embodiment in which the substrate 300 is silicon having a fluorosilicate glass layer formed thereon. The first dielectric layer 302 has a thickness of about 5,000 Å to about 10,000 Å, depending on the size of the structure to be fabricated.

A silicon carbide layer 304 is formed on the first dielectric layer 302. The silicon carbide layer 304 is formed on the first dielectric layer 302 according to the process parameters described above. The silicon carbide layer 304 has a dielectric constant less than about 4.5, so as to prevent or minimize capacitive coupling between the metal interconnects to be formed in the damascene structure. The dielectric constant of the silicon carbide layer is tunable, in that it can be varied in the desired range as a function of the composition of the gas mixture as well as the power ratio of the applied electric field during layer formation.

The thickness of the silicon carbide layer 304 is variable depending on the specific stage of processing. Typically, the silicon carbide layer 304 has a thickness of about 200 Å to about 1000 Å.

Figure 3B:
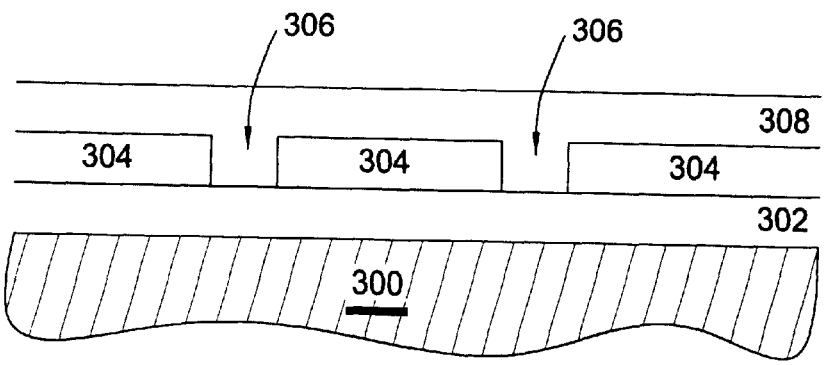

Referring to FIG. 3b, the silicon carbide layer 304 is patterned and etched to define contact/via openings 306 and to expose the first dielectric layer 302, in areas where the contacts/vias are to be formed. The silicon carbide layer is patterned using conventional lithography as described above with reference to FIGS. 2b–2d. The silicon carbide layer may be etched with carbon tetrafluoride ($CF_4$), or a gas mixture comprising trifluoromethane ($CHF_3$) and oxygen ($O_2$). After the silicon carbide layer 304 is patterned, a second dielectric layer 308 is deposited thereover. The second dielectric layer 308 may be an oxide (e. g., silicon dioxide, fluorosilicate glass). The second dielectric layer 308 has a thickness of about 5,000 Å to about 10,000 Å.

Figure 3C:
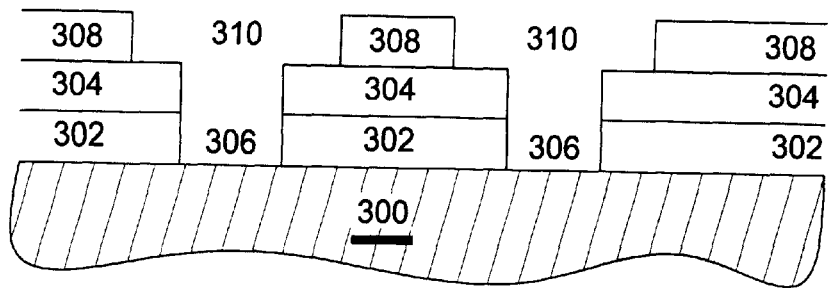

The second dielectric layer 308 is then patterned to define interconnect lines 310, as illustrated in FIG. 3c, preferably using conventional lithography processes described above. The interconnects 310 formed in the second dielectric layer 308 are positioned over the contacts/via openings 306 in the silicon carbide layer 304. Thereafter, both the interconnects 310 and contacts/vias 306 are etched using reactive ion etching or other anisotropic etching techniques.

Figure 3D:
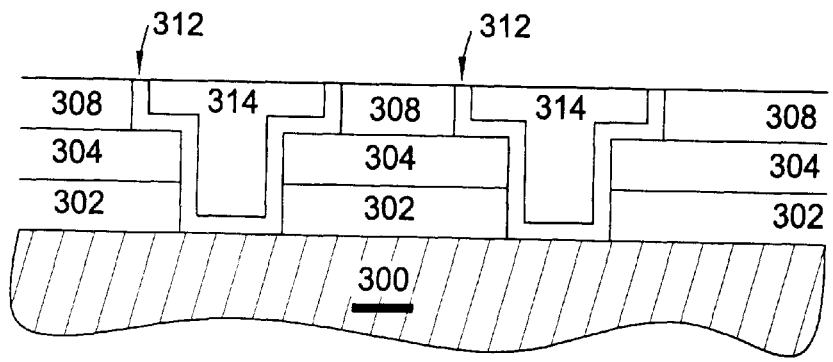

Referring to FIG. 3d, the interconnects 20 and contacts/vias 306 are filled with a conductive material 24 such as aluminum (Al), copper (Cu), tungsten (W), or combinations thereof. Preferably, copper is used to fill the interconnects 310 and the contacts/vias 306 due to its low resistivity (resistivity about 1.7 $\mu\Omega$-cm). The conductive material 24 is deposited using chemical vapor deposition (CVD), physical vapor deposition (PVD), electroplating, or combinations thereof, to form the damascene structure. Additionally, a barrier layer 22 such as tantalum (Ta), tantalum nitride (TaN), or other suitable barrier material is first deposited conformably on the sidewalls of the interconnects 20 and contacts/vias 306 to prevent metal migration into the surrounding dielectric layers 302, 308 as well as the silicon carbide layer 304.

C. Silicon Carbide Anti-Reflective Coating (ARC)

Figure 4A:
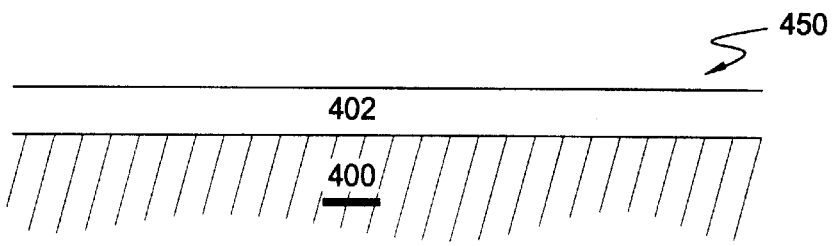
FIGS. 4a–4e depict schematic cross-sectional views of a substrate structure at different stages of integrated circuit fabrication incorporating a silicon carbide layer as an anti-reflective coating (ARC).

FIGS. 4a–4e illustrate schematic cross-sectional views of a substrate 400 at different stages of an integrated circuit fabrication sequence incorporating a silicon carbide layer as an anti-reflective coating (ARC). In general, the substrate 400 refers to any workpiece on which film processing is performed, and a substrate structure 450 is used to generally denote the substrate 400 together with other material layers formed on the substrate 400. Depending on the specific stage of processing, substrate 400 may correspond to a silicon wafer, or other material layer, which has been formed on the substrate. FIG. 4a, for example, illustrates a cross-sectional view of a substrate structure 450 in which the substrate 400 is a silicon wafer.

A silicon carbide layer 402 is formed on the substrate structure 450. The silicon carbide layer 402 is formed on the substrate structure 450 according to the process parameters described above. The silicon carbide layer has an absorption coefficient ($\kappa$) that can be varied between about 0.1 to about 0.7 at wavelengths below about 250 nm (nanometers), making it suitable for use as an anti-reflective coating (ARC) at DUV wavelengths. The absorption coefficient of the silicon carbide layer is tunable, in that it can be varied in the desired range as a function of the deposition temperature as well as the carbon concentration in the gas mixture during layer formation. The thickness of the silicon carbide layer 402 is variable depending on the specific stage of processing. Typically, the silicon carbide layer has a thickness of about 200 Å to about 2000 Å.

Figure 4B:
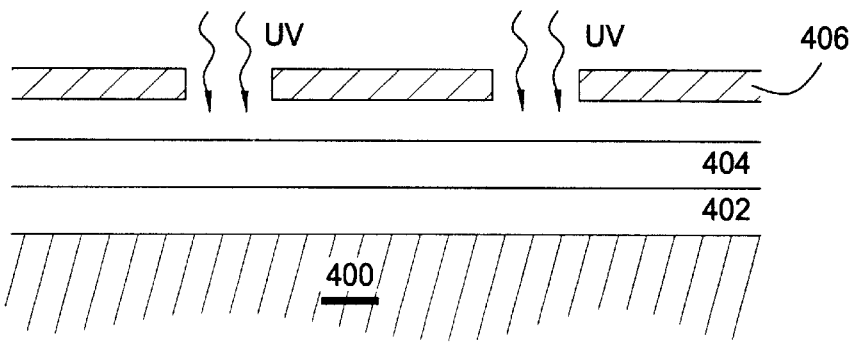

FIG. 4b depicts a layer of energy sensitive resist material 404 formed on the substrate structure 450 of FIG. 4a. The layer of energy sensitive resist material can be spin coated on the substrate structure 450 to a thickness within a range of about 2000 Å to about 6000 Å. The energy sensitive resist material is sensitive to DUV radiation having a wavelength less than 250 nm.

An image of a pattern is introduced into the layer of energy sensitive resist material 404 by exposing such energy sensitive resist material 404 to DUV radiation via mask 406. When the image of the pattern is introduced into the layer of energy sensitive resist material 404, the silicon carbide layer 402 suppresses any reflections off underlying material layers (e. g., oxides, metals) which can degrade the image of the pattern introduced in the layer of energy sensitive resist material 404.

Figure 4C:
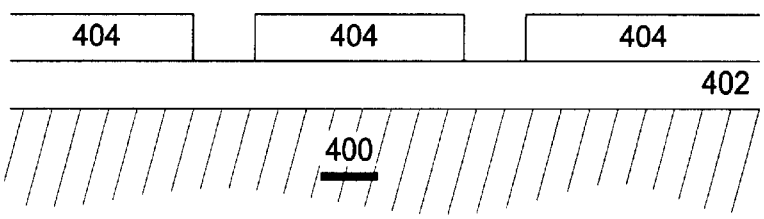
Figure 4D:
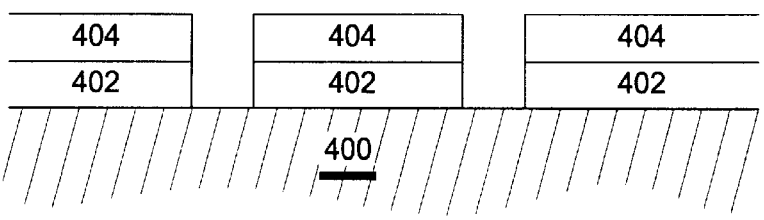

The image of the pattern introduced into the layer of energy sensitive resist material 404 is developed in an appropriate developer to define the pattern through such layer, as shown in FIG. 4*c*. Thereafter, referring to FIG. 4*d*, the pattern defined in the energy sensitive resist material 404 is transferred through the silicon carbide layer 402. The pattern is transferred through the silicon carbide layer 402 using the energy sensitive resist material 404 as a mask. The pattern is transferred through the silicon carbide layer 402 by etching it using an appropriate chemical etchant (e. g., carbon tetrafluoride ($CF_4$), or a gas mixture comprising trifluoromethane ($CHF_3$) and oxygen ($O_2$)).

Figure 4E:
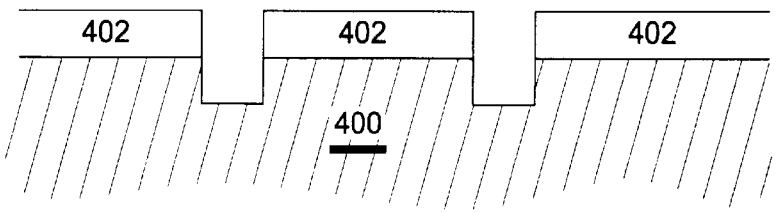

After the silicon carbide layer 402 is patterned, such pattern is typically transferred into the substrate 400, as shown in FIG. 4*e*. The pattern is transferred into the substrate 400 using the silicon carbide ARC layer 402 as a hardmask. The pattern is transferred into the substrate 400 by etching it using an appropriate chemical etchant. Thereafter, the silicon carbide layer 402 is optionally removed from the substrate structure 450 by etching it using an appropriate chemical etchant (e. g., carbon tetrafluoride ($CF_4$), or a gas mixture comprising trifluoromethane ($CHF_3$) and oxygen ($O_2$)).

Although several preferred embodiments which incorporate the teachings of the present invention have been shown and described in detail, those skilled in the art can readily devise many other varied embodiments that still incorporate these teachings.

What is claimed is:

1. A method of layer deposition comprising:
    positioning a substrate in a deposition chamber;
    providing a gas mixture to the deposition chamber, wherein the gas mixture comprises a silicon source, a carbon source, and an inert gas; and
    reacting the gas mixture in the presence of an electric field to form a silicon carbide (SiC) layer on the substrate, wherein the electric field is generated using mixed frequency radio frequency (RF) power and the silicon carbide layer is an antireflective coating (ARC) at wavelengths less than about 250 nm.

2. A method of forming a device, comprising:
    forming a silicon carbide layer on a substrate, wherein the silicon carbide layer is formed by reacting a gas mixture comprising a silicon source, a carbon source and an inert gas in the presence of an electric field generated in a deposition chamber using mixed frequency radio frequency (RF) power; and
    defining a pattern in at least one region of the silicon carbide layer.

3. The method of claim 2 further comprising transferring the pattern defined in the at least one region of the silicon carbide layer into the substrate using the silicon carbide layer as a mask.

4. The method of claim 3 further comprising the step of removing the silicon carbide layer from the substrate.

5. The method of claim 2 wherein the substrate has one or more material layers formed thereon.

6. The method of claim 2 wherein definition of the pattern in the at least one region of the silicon carbide layer, comprises:
    forming a layer of energy sensitive resist material on the silicon carbide layer;
    introducing an image of the pattern into the layer of energy sensitive resist material by exposing the energy sensitive resist material to patterned radiation;
    developing the image of the pattern introduced into the layer of energy sensitive resist material; and
    transferring the pattern through the silicon carbide layer using the layer of energy sensitive resist material as a mask.

7. The method of claim 6 further comprising:
    forming an intermediate layer in the silicon carbide layer prior to forming the layer of energy sensitive resist thereon, introducing the image of a pattern therein, and developing the pattern;
    transferring the image of the pattern developed in the layer of energy sensitive resist material through the intermediate layer using the energy sensitive resist material as a mask; and
    transferring the pattern through the silicon carbide layer using the intermediate layer as a mask.

8. The method of claim 7 wherein the intermediate layer is an oxide.

9. The method of claim 8 wherein the oxide is selected from the group of silicon dioxide, fluorosilicate glass (FSG), and silicon oxynitride.

10. The method of claim 4 wherein the silicon carbide layer is removed from the substrate using a fluorine-based compound.

11. The method of claim 10 wherein the fluorine-based compound is selected from the group of carbon tetrafluoride ($CF_4$) and trifluoromethane ($CHF_3$).

12. The method of claim 11 wherein the silicon carbide layer is an anti-reflective coating at wavelengths less than about 250 nm (nanometers).

13. The method of claim 2 wherein the silicon carbide layer has an absorption coefficient in a range of about 0.1 to about 0.7 at wavelengths less than about 250 nm.

14. The method of claim 13 wherein the absorption coefficient varies across the thickness of the silicon carbide layer from about 0.1 to about 0.7 at wavelengths less than about 250 nm.

15. The method of claim 12 wherein the silicon carbide layer has an index of refraction in a range of about 1.7 to about 2.1.

16. The method of claim 2 wherein the silicon source and the carbon source comprise an organosilane compound having a general formula $Si_xC_yH_z$, wherein x has a range of 1 to 2, y has a range of 1 to 6, and z has a range of 4 to 20.

17. The method of claim 16 wherein the organosilane compound is selected from the group of methylsilane ($SiCH_6$), dimethylsilane ($SiC_2H_8$), trimethylsilane ($SiC_3H_{10}$), tetramethylsilane ($SiC_4H_{12}$), diethylsilane ($SiC_4H_{12}$), and combinations thereof.

18. The method of claim 2 wherein the silicon source and the carbon source are selected from the group of silane ($SiH_4$), methane ($CH_4$), disilane ($Si_2H_6$), and combinations thereof.

19. The method of claim 2 wherein the inert gas is selected from the group of helium (He), argon (Ar), nitrogen ($N_2$), and combinations thereof.

20. The method of claim 16 wherein the ratio of the organosilane compound to the inert gas in the gas mixture is in a range of about 1:1 to about 1:4.

21. The method of claim 2 wherein the substrate is heated to a temperature between about 200° C. to about 400° C.

22. The method of claim 2 wherein the gas mixture is reacted at a pressure between about 3 torr to about 15 torr.

23. The method of claim 2 wherein the mixed frequency RF power comprises at least a first RF power having a frequency in a range of about 13 MHz to about 27 MHz and at least a second RF power having a frequency in a range of about 100 KHz to about 500 KHz.

24. The method of claim 23 wherein the first RF power is in a range of about 200 watts to about 600 watts.

25. The method of claim 23 wherein the second RF power is in a range of about 1 watt to about 150 watts.

26. The method of claim 25 wherein the ratio of the second RF power to the total mixed frequency RF power is less than about 0.6:1.0.

27. The method of claim 2 wherein the silicon carbide layer has a dielectric constant less than about 4.5.

28. A method of fabricating a damascene structure, comprising:

providing a substrate having a first dielectric layer thereon;

forming a silicon carbide layer on the dielectric layer, wherein the silicon carbide layer is formed by reacting a gas mixture comprising a silicon source, a carbon source and an inert gas in the presence of an electric field generated in a deposition chamber using mixed frequency radio frequency (RF) power;

patterning the silicon carbide layer to define contacts/vias therethrough;

forming a second dielectric layer on the patterned silicon carbide layer;

patterning the second dielectric layer to define interconnects therethrough, wherein the interconnects are positioned over the contacts/vias defined in the silicon carbide layer;

transferring the contact/via pattern through the first dielectric layer using the silicon carbide layer as a mask; and filling the contacts/vias and interconnects with a conductive material.

29. The method of claim 28 wherein the first dielectric layer, the second dielectric layer, and the silicon carbide layer each have dielectric constants less than about 4.5.

30. The method of claim 28 wherein the conductive material filling the contacts/vias and interconnects has a resistivity less than about 5 $\mu\Omega$-cm (microohms-centimeters).

31. The method of claim 28 wherein the first dielectric layer and the second dielectric layer are selected from the group of silicon dioxide, organosilicate, fluorosilicate glass (FSG), and carbon doped fluorosilicate glass (FSG).

32. The method of claim 28 wherein the conductive material filling the contacts/vias and the interconnects is selected from the group of copper (Cu), aluminum (Al), tungsten (W), and combinations thereof.

33. The method of claim 28 wherein the silicon source and the carbon source comprise an organosilane compound having a general formula $Si_xC_yH_z$, wherein x has a range of 1 to 2, y has a range of 1 to 6, and z has a range of 4 to 20.

34. The method of claim 33 wherein the organosilane compound is selected from the group of methylsilane ($SiCH_6$), dimethylsilane ($SiC_2H_8$), trimethylsilane ($SiC_3H_{10}$), tetramethylsilane ($SiC_4H_{12}$), diethylsilane ($SiC_4H_{12}$), and combinations thereof.

35. The method of claim 28 wherein the silicon source and the carbon source are selected from the group of silane ($SiH_4$), methane ($CH_4$), disilane ($Si_2H_6$), and combinations thereof.

36. The method of claim 28 wherein the inert gas is selected from the group of helium (He), argon (Ar), nitrogen ($N_2$), and combinations thereof.

37. The method of claim 33 wherein the ratio of the organosilane compound to the inert gas is in a range of about 1:1 to about 1:4.

38. The method of claim 28 wherein the substrate is heated to a temperature between about 200° C. to about 400° C.

39. The method of claim 28 wherein the gas mixture is reacted at a pressure between about 3 torr to about 15 torr.

40. The method of claim 28 wherein the mixed frequency RF power comprises at least a first RF power having a frequency in a range of about 13 MHz to about 27 MHz and at least a second RF power having a frequency in a range of about 100 KHz to about 500 KHz.

41. The method of claim 40 wherein the first RF power is in a range of about 200 watts to about 600 watts.

42. The method of claim 40 wherein the second RF power is in a range of about 1 watt to about 150 watts.

43. The method of claim 42 wherein the ratio of the second RF power to the total mixed frequency RF power is less than about 0.6:1.0.

44. The method of claim 28 wherein the silicon carbide layer is an anti-reflective coating (ARC) at wavelengths less than about 250 nm.

* * * * *

UNITED STATES PATENT AND TRADEMARK OFFICE
CERTIFICATE OF CORRECTION

PATENT NO.     : 6,465,366 B1
DATED          : October 15, 2002
INVENTOR(S)    : Srinivas Nemani et al.

It is certified that error appears in the above-identified patent and that said Letters Patent is hereby corrected as shown below:

Title page,
Item [56], FOREIGN PATENT DOCUMENTS, please change "GB" to -- EP --.

Column 8,
Line 12, please change "20" to -- 310 --.
Line 13, please change "24" to -- 314 --.
Line 18, please change "24" to -- 314 --.
Line 22, please change "22" to -- 312 --.
Line 25, please change "20" to -- 310 --.

Signed and Sealed this

Eighteenth Day of March, 2003

JAMES E. ROGAN
*Director of the United States Patent and Trademark Office*